United States Patent [19]

Donnelly et al.

[11] Patent Number: 4,645,687

[45] Date of Patent: Feb. 24, 1987

[54] DEPOSITION OF III-V SEMICONDUCTOR MATERIALS

[75] Inventors: Vincent M. Donnelly, Berkeley Heights; Robert F. Karlicek, Jr., Plainfield, both of N.J.

[73] Assignee: AT&T Laboratories, Murray Hill, N.J.

[21] Appl. No.: 778,274

[22] Filed: Sep. 16, 1985

Related U.S. Application Data

[63] Continuation of Ser. No. 550,759, Nov. 10, 1983, abandoned.

[51] Int. Cl.⁴ .......................................... H01L 21/205
[52] U.S. Cl. .................................. 427/53.1; 156/613; 427/87
[58] Field of Search ................... 427/53.1, 87; 156/613

[56] References Cited

U.S. PATENT DOCUMENTS

| | | | |
|---|---|---|---|
| 4,260,649 | 4/1981 | Denison | 427/53.1 |
| 4,340,617 | 7/1982 | Deutsch | 427/53.1 |
| 4,359,485 | 11/1982 | Donnelly | 427/53.1 |
| 4,447,469 | 5/1984 | Peters | 427/87 |

OTHER PUBLICATIONS

Moison et al, "Laser-Induced Surface Defects", Mat. Res. Soc. Symp. Proc., vol. 13, (1983), pp. 329-334.
Antypas, "Prevention of InP Surface Decomposition . . . ", Applied Physics Letters, vol. 37, No. 1, Jul. 1980, pp. 64, 65.
Ehrlich et al, "Photodeposition of Metal Films with Ultraviolet Laser Light", Journal of Vacuum Sciences and Technology, vol. 21, No. 1, (1982), pp. 23-32.
Andreatta et al, "Low-Temperature . . . by Ultraviolet Laser Photodissociation of Silane . . . ", Applied Physics Letters, 40, (2), Jan. 15, 1982, pp. 183-185.
Boyer et al, "Laser-Induced . . . ", Applied Physics Letters, 40, (8), Apr. 15, 1982, pp. 716-719.
Silversmith et al, "Laser-Photochemical . . . ", Conferences: 1981 Symposium on VLSI Technology, Digest of Technical Papers, Maui, HI, 9-11 Sep. 1981, pp. 70, 71.

Primary Examiner—John D. Smith
Attorney, Agent, or Firm—Bruce S. Schneider

[57] ABSTRACT

A low temperature procedure for depositing III-V semiconductor materials that offers the possibility of higher deposition rates together with abrupt junction formation has been found. This process involves the irradiation at a deposition substrate with a high power density radiation source of deposition gases such as organometallic materials, e.g., trimethyl gallium and trimethyl indium. By utilizing a sufficiently high power density, multiphoton processes are induced in the deposition gas that, in turn, lead to advantageous deposited materials.

11 Claims, 1 Drawing Figure

U.S. Patent   Feb. 24, 1987   4,645,687
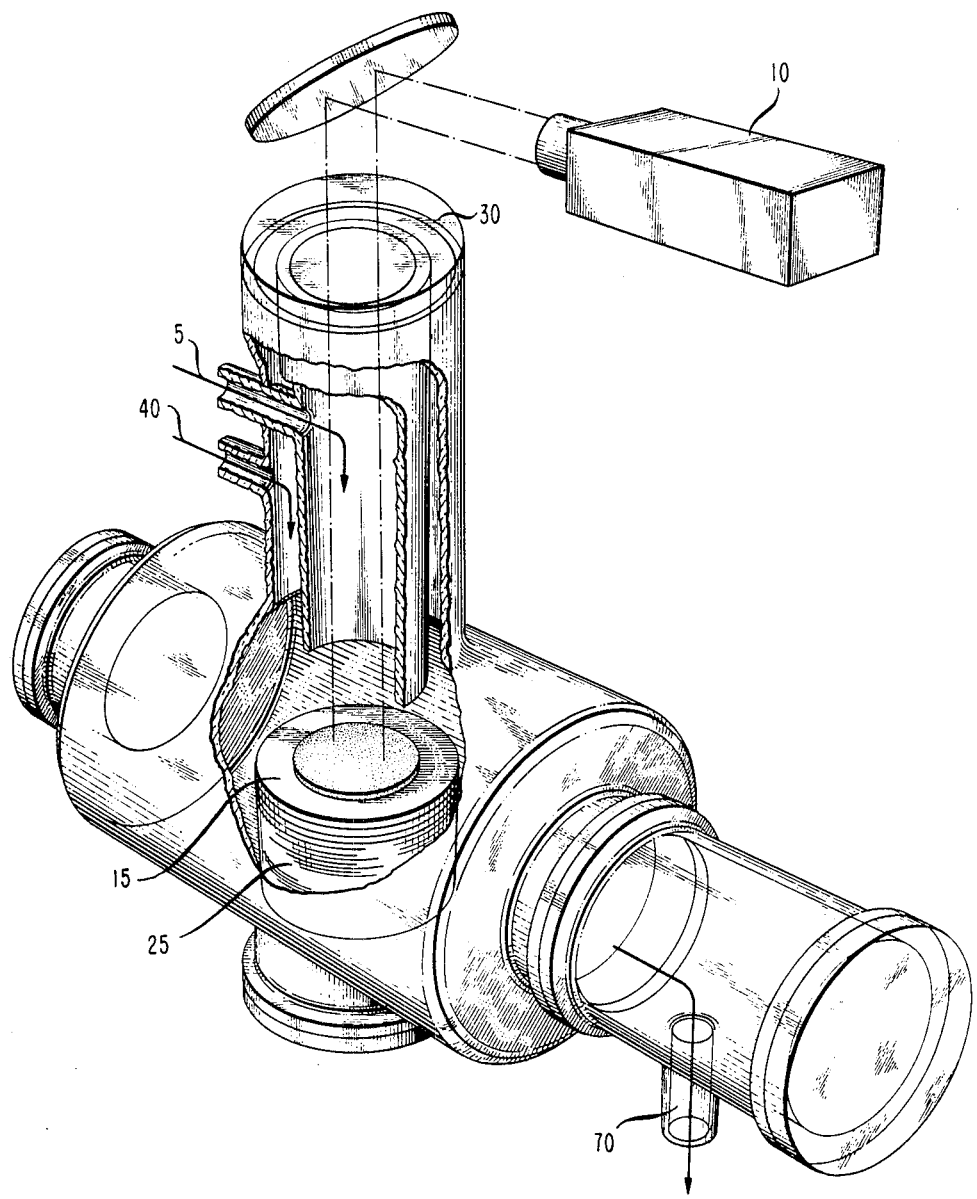

1

DEPOSITION OF III-V SEMICONDUCTOR MATERIALS

This application is a continuation of application Ser. No. 550,759, filed Nov. 10, 1983, now abandoned.

BACKGROUND OF THE INVENTION

1. Field of the Invention

This invention relates to semiconductor material processing and in particular to III-V semiconductor material processing.

2. Art Background

Low temperature alternatives to conventional chemical vapor deposition processes have been sought for the deposition of materials such as III-V semiconductor thin films utilized in a variety of device fabrication procedures. Low temperature processes, i.e., processes involving temperatures lower than 500 degrees C., offer the advantage of allowing deposition of a film without substantially affecting previously deposited layers containing materials that undergo compositional and/or phase changes at relatively low temperatures.

One approach being pursued in an attempt to achieve low temperature deposition involves the use of photostimulated techniques. In these techniques, electromagnetic radiation from a source such as a laser or a high intensity lamp is utilized to induce a chemical reaction in a gas that is present at the substrate upon which deposition is desired. Such radiation induced processes have fallen generally into two categories. In the first category, an ultraviolet lamp has been utilized in attempts to induce dissociation in a deposition gas, e.g., a metal organic compound, through photodecomposition to produce semiconductor material. However, as reported by Aylett and Haight (Materials Research Society Symposium, Boston, November 1982, paper I5.4), the use of an ultraviolet lamp in conjunction with organometallic materials such as $(CH_3)_3InP(CH_3)_3$ leads only to the formation of indium droplets or alternatively to indium phosphide whiskers.

In a second approach directed to the deposition of III-V materials, a laser such as a Nd-YAG laser (532 nm) is utilized to irradiate a substrate in the presence of a deposition gas such as a composition including trimethyl gallium and arsine ($AsH_3$). The laser is chosen so that its wavelength intensity is centered at energies that are not absorbed by the gas but that are instead absorbed by the substrate to produce surface heating. This heating, as reported by Roth et al (Materials Research Society Symposium, Boston, November 1982, paper I6.2), pyrolyzes the trimethyl gallium and the arsine, resulting in gallium and arsenic entities that combine to form a gallium arsenide deposit. Although by this approach gallium arsenide, rather than gallium droplets, is obtained in deposition regions substantially larger than whisker size, the process induces substantial substrate heating and in fact is essentially the same as other high temperature approaches. Thus, although there are processing advantages potentially available through the utilization of photo-stimulated processes, the procedures pursued have not yielded satisfactory results for III-V materials or are, in fact, not low temperature techniques.

SUMMARY OF THE INVENTION

Low temperature deposition of compound semiconductor materials, such as III-V semiconductor materials, that allows the production of useful semiconductor devices has been achieved by utilizing a specific radiation induced process. In particular, a high intensity source of electromagnetic radiation is employed, together with a deposition gas (rather than or in addition to a substrate) that absorbs this radiation. The intensity of the actinic radiation is maintained at a sufficiently high level so that multiphoton dissociation processes in the deposition gas are induced. For example, by irradiating a gas including an adduct of $(CH_3)_3In$ and $P(CH_3)_3$ and a separate source of $P(CH_3)_3$ with an ArF excimer laser (193 nm center wavelength), multiphoton processes are induced, and low temperature deposition of indium phosphide is produced on a substrate region adjacent to the illuminated portion of the gas.

Through the invention, not only is low temperature, i.e., temperature below 500 degrees C., deposition of compound semiconductor materials achieved, but also deposition occurs at quite nominal rates, e.g., at a rate greater than 100 Å/min. Additionally, through the use of this process, abrupt junction formation is achievable. This result is accomplished by irradiating a deposition gas of a first composition to produce one material layer, extinguishing the radiation, introducing a second deposition gas, and again irradiating to produce a second material layer.

BRIEF DESCRIPTION OF THE DRAWING

The FIGURE is illustrative of an apparatus suitable for use of the invention.

DETAILED DESCRIPTION

The advantages of the inventive process involve the utilization of an incident flux of electromagnetic radiation that induces dissociation in the deposition gas through multiphoton absorption to form a compound semiconductor material, e.g., a III-V semiconductor material such as indium phosphide, gallium arsenide, and ternaries and quaternaries based on chemical combinations of indium, gallium, arsenic, aluminum, and phosphorus. In this context, multiphoton or multiple photon absorption is defined as a total photon absorption by the absorbing molecule and its fragments of two or more photons to induce partial or complete dissociation of the absorbing molecule in at least 0.01 percent of the irradiated gas molecules. Thus, for example, if trimethyl indium is present in the deposition gas, light having a wavelength of 193 nm induces a multiphoton process that leads to fragments such as indium atoms.

The intensity of light required to induce multiple photon dissociation processes is quite significant and should be substantially higher than that required to produce dissociation through pathways involving single photon absorption. In particular, for typical gases such as organometallic gases, power densities in the range 0.1 $MW/cm^2$ to 10 $GW/cm^2$ over a time period of at least a picosecond are required to produce the desired multiphoton dissociation. To satisfy this criterion, the power density is computed only for wavelengths within the incident electromagnetic radiation spectrum at which entities in the deposition gas containing atoms ultimately to be incorporated in the material to be deposited have an absorption coefficient greater than 10 l/mole/cm. Entities within the deposition gas for the computation include both molecules and molecular fragments. Absorption coefficients are measured by well-known techniques, such as described in J. G. Calvert and J. N. Pitts, Jr., Wiley & Sons, Inc., New York, 1966. Generally, for energy densities below 0.1 MW/cm$^2$, multiphoton processes are not substantially induced, while for energy densities above 10 GW/cm$^2$, undesirable by-products are produced.

The desired energy flux to induce multiphoton processes is typically produced by employing a pulsed laser source. The repetition rate (i.e., the exposure time) and the extent of beam focus determine the fragment level available for layer formation. Generally, for levels sufficient to produce advantageous deposition rates, e.g., typically those greater than 0.1 $\mu$m/hr, repetition rates in the range 0.1 Hz to 10,000 Hz are utilized with the beam sufficiently focused to obtain power densities as described above. (It is possible that other processes such as single photon dissociation are also occurring during the inventive process. However, to obtain the desirable results of the invention, fragments from multiphoton dissociation should result in at least 50 percent of the layer formation at a deposition rate of at least 0.1 $\mu$m/hr.)

The concentration of the gas in the vicinity of the deposition substrate also affects the deposition process. If the concentration is too low, an insufficient quantity of deposition fragments if produced, and therefore an extremely low deposition rate is obtained. If the concentration is too high, incident light is absorbed relatively far from the substrate, with a resulting substantial decrease in the level of deposition fragments reaching the substrate surface. Thus, the concentration of the deposition gas should be chosen so that the absorption of at least 1 percent of the incident light that is capable of inducing dissociation through multiphoton processes occurs in a region within 1 cm of the deposition surface. (Although heating of the substrate is not required for the invention, heating of the substrate by, for example, radio frequency generators, high intensity lamps, or resistive heaters, to temperatures in the range 100 degrees C. to 500 degrees C. is at times advantageous because of the improved properties of the film, e.g., enhanced surface diffusion leading to improved epitaxy for III–V semiconductor films.)

The components of the deposition gas are chosen to yield fragments that combine to yield the desired semiconductor material. Typically, trialkyl metals and/or trialkyl pnictides are employed where the alkyl group is generally either ethyl or methyl. For example, to yield suitable fragments containing a Group III atom, materials, e.g., organometallic compounds such as trialkyl metals, e.g., $(CH_3)_3In$, $(CH_3)_3Al$, and $(CH_3)_3Ga$ are utilized to, for example, produce upon irradiation indium, aluminum, and gallium containing fragments. (Often an adduct of $(CH_3)_3In$ and $(CH_3)_3P$ is employed rather than $(CH_3)_3In$ alone since the latter is pyrophoric while the former combination is not.) Sources of the Group V atom such as phosphorus and arsenic atoms are obtained by fragmentation of gases, e.g., (1) $PH_3$ and/or trialkyl pnictides such as $P(CH_3)_3$ and (2) $AsH_3$ and/or trialkyl metals such as $As(CH_3)_3$, respectively. Thus, for example, in indium phosphide is the desired deposited material, then deposition gas constituents such as $(CH_3)_3In$ and $P(CH_3)_3$ are utilized. If gallium arsenide is the desired material, then deposition gas constituents such as $Ga(CH_3)_3$ and $As(CH_3)_3$ are utilized. Similarly, if a ternary such as indium gallium arsenide or gallium aluminum arsenide is to be formed, deposition gas constituents such as $(CH_3)_3In$, $(CH_3)_3Ga$, and $(CH_3)_3As$, or $(CH_3)_3Al$, $(CH_3)_3Ga$, and $(CH_3)_3As$, respectively, are used, while if a quaternary such as indium gallium arsenide phosphide is desired, combinations such as $(CH_3)_3In/(CH_3)_3Ga/P(CH_3)_3/As(CH_3)_3$ are employed.

The ratio of the Group III atom containing constituent to the Group V atom containing constituent also influences the material obtained. Indeed, for ternaries and quaternaries, the ratio of the various gas constituents determines the precise stoichiometry of the deposited material. Typically, there is no method of a priori determining the precise gas ratio that will yield a desired stoichiometry. A control sample is utilized to determine the constituent ratio that yields the desired deposited layer stoichiometry.

Once the desired material is deposited, the device is completed by conventional techniques. The following examples are illustrative of the subject invention.

EXAMPLE 1

Deposition was performed on irregular sized substrates having surface areas of approximately 2 cm$^2$ and whose major surface was in the (100) plane. The substrates were cleaned by sequentially immersing them in boiling chloroform, boiling acetone, and boiling methanol. The substrates were then rinsed with deionized water and dipped for approximately 10 seconds in a 1:10 by volume solution of HF in water. The substrates were then etched by immersing them in a 10:1:1 solution which included sulfuric acid, $H_2O_2$ (50 percent), and water. The substrates were maintained in this etchant for 5 minutes and then rinsed by sequentially subjecting them to five 10-second agitated immersions in deionized water. The substrates were then again immersed in the aqueous HF solution and then blown dry in dry nitrogen.

The substrates were inserted on the sample holder of the apparatus shown in the FIGURE. This apparatus included a sample holder, 15, an excimer laser light source (193 nm), 10, suprasil TM window, 30, and a heater, 25. The apparatus was then evacuated through port, 70, to a pressure of approximately 20 mTorr. A flow of helium of approximately 140 sccm was introduced through port, 5. After approximately 5 minutes, a flow of hydrogen at a rate of approximately 150 sccm was introduced through inlet, 40. The sbstrates were heated to a temperature of 100 degrees C. using heater, 25. A flow of approximately 30 sccm of trimethyl phosphine was established and initially run through a tube which bypassed the reactor. Similarly, a flow of helium at the rate of approximately 86 sccm was passed through a bubbler containing an adduct of trimethyl indium and trimethyl phosphine held at approximately 50 degrees C. The helium flow exiting the bubbler was also initially routed to bypass the reactor. After these two flows were established, they were combined and introduced into inlet, 40, together with the initial hydrogen flow. (The total pressure was approximately 2 Torr.) Within 5 seconds of this introduction, light from the excimer laser was introduced through window, 30, and made incident in the region above the substrate. This excimer laser had a pulse rate of approximately 5 Hz, was focused to a beam spot size of approximately 2×4 mm, and had a peak power of approximately 10 MW/cm$^2$. The laser illumination was continued for approximately 30 minutes and then terminated. Within 5 seconds of the termination of illumination, the deposition gases were again routed so that they bypassed the reactor. The hydrogen gas flow was then terminated and the substrate removed from the chamber. A continuous specular layer of indium phosphide having a stoichiometry of 1:1 was obtained. This layer had no carbon or oxygen impurities as measured by Auger spectrometry. The thickness of the layer was approximately 800 Å.

EXAMPLE 2

The procedure of Example 1 was followed, except a gallium arsenide deposition substrate was utilized. The gallium arsenide substrate was cleaned by sequential treatment with chloroform, acetone, and methanol and then by immersion in a 1:10 hydrogen chloride aqueous solution.

What is claimed is:

1. A method for forming a device comprising the steps of forming a compound semiconductor region and completing said device wherein said compound semiconductor region is formed by causing decomposition in a deposition gas characterized in that said decomposition comprises a multiphoton absorption process induced by electromagnetic radiation of power densities in the range of 0.1 MW/cm$^2$ to 10 GW/cm$^2$.

2. The process of claim 1 wherein said electromagnetic radiation comprises laser light.

3. The process of claim 2 wherein said compound semiconductor comprises a III–V semiconductor material.

4. The process of claim 3 wherein said III–V semiconductor material comprises a member chosen from the group consisting of gallium arsenide, gallium indium arsenide phosphide, indium gallium arsenide, gallium aluminum arsenide, and indium phosphide.

5. The process of claim 1 wherein said compound semiconductor comprises a III–V semiconductor material.

6. The process of claim 5 wherein said III–V semiconductor material comprises a member chosen from the group consisting of gallium arsenide, gallium indium arsenide phosphide, indium gallium arsenide, gallium aluminum arsenide, and indium phosphide.

7. The process of claim 1 wherein said deposition gas comprises a Group III trialkyl.

8. The process of claim 7 wherein said deposition gas includes a trialkyl phosphine.

9. The process of claim 1 wherein said electromagnetic radiation comprises light from an excimer laser.

10. The process of claim 9 wherein said compound semiconductor comprises a III–V semiconductor material.

11. The process of claim 10 wherein said III–V semiconductor material comprises a member chosen from the group consisting of gallium arsenide, gallium indium arsenide phosphide, indium gallium arsenide, gallium aluminum arsenide, and indium phosphide.

* * * * *